(12) United States Patent
Lee et al.

(10) Patent No.: US 10,437,499 B2
(45) Date of Patent: Oct. 8, 2019

(54) HYBRID MEMORY SYSTEM AND METHOD OF OPERATING THE SAME

(71) Applicant: NANYA TECHNOLOGY CORPORATION, New Taipei (TW)

(72) Inventors: Chung-Hsun Lee, New Taipei (TW); Hsien-Wen Liu, Taoyuan County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/900,013

(22) Filed: Feb. 20, 2018

(65) Prior Publication Data

US 2019/0196733 A1    Jun. 27, 2019

Related U.S. Application Data

(60) Provisional application No. 62/609,641, filed on Dec. 22, 2017.

(51) Int. Cl.
*G06F 3/06* (2006.01)
*G11C 11/406* (2006.01)

(52) U.S. Cl.
CPC ............ *G06F 3/0634* (2013.01); *G06F 3/068* (2013.01); *G06F 3/0619* (2013.01); *G06F 3/0625* (2013.01); *G06F 3/0647* (2013.01); *G06F 3/0659* (2013.01); *G11C 11/40611* (2013.01)

(58) Field of Classification Search
None
See application file for complete search history.

(56) References Cited

U.S. PATENT DOCUMENTS

| | | | |
|---|---|---|---|
| 2009/0027989 A1* | 1/2009 | Michalak | G11C 11/406 365/222 |
| 2010/0274960 A1* | 10/2010 | Lee | G06F 12/0607 711/106 |
| 2014/0192583 A1* | 7/2014 | Rajan | G11C 7/10 365/63 |
| 2014/0304475 A1* | 10/2014 | Ramanujan | G06F 12/0895 711/128 |

* cited by examiner

*Primary Examiner* — Douglas King
(74) *Attorney, Agent, or Firm* — Muncy, Geissler, Olds & Lowe, P.C.

(57) ABSTRACT

The present disclosure provides a hybrid memory system and a method of operating the same. The hybrid memory system includes a non-volatile memory, a volatile memory and a controller. The volatile memory stores data. The controller is configured to move the data from the volatile memory to the non-volatile memory in response to a command to enter a power-saving mode. The controller precludes the volatile memory from having a self-refresh operation performed thereon after the movement of the data.

11 Claims, 15 Drawing Sheets

HYBRID MEMORY SYSTEM AND METHOD OF OPERATING THE SAME

PRIORITY CLAIM AND CROSS-REFERENCE

This application claims the benefit of provisional application Ser. 62/609,641 filed on Dec. 22, 2017 and entitled "METHOD OF OPERATING A DRAM," the disclosure of which is hereby incorporated by reference in its entirety.

TECHNICAL FIELD

The present disclosure relates to a hybrid memory system and a method of operating the same, and more particularly, to a hybrid memory system including a volatile memory and a non-volatile memory.

DISCUSSION OF THE BACKGROUND

Dynamic random access memory (DRAM) is a type of random access memory that stores each bit of data in a separate capacitor. A simplest DRAM cell comprises a single N-type metal-oxide-semiconductor (NMOS) transistor and a single capacitor. If charge is stored in the capacitor, the cell is said to store a logic HIGH, depending on the convention used. If no charge is present, the cell is said to store a logic LOW. Because the charge in the capacitor dissipates over time, DRAM systems require additional refreshing circuitries to periodically refresh the charge stored in the capacitors. Since a capacitor can store only a very limited amount of charge, in order to quickly distinguish the difference between a logic HIGH and a logic LOW, two bit lines (BLs) are typically used for each bit, wherein the first bit line in the bit line pair is known as a bit line true (BLT) and the other bit line in the bit line pair is the bit line complement (BLC). The single NMOS transistor's gate is controlled by a word line (WL). To maintain data integrity, it is required to perform a refresh operation, resulting in power consumption.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a hybrid memory system. The hybrid memory system includes a non-volatile memory, a volatile memory and a controller. The volatile memory is configured to store data. The controller is configured to move the data from the volatile memory to the non-volatile memory in response to a command which requests to enter a power-saving mode. The controller is configured to preclude the volatile memory from having a self-refresh operation performed thereon after the movement of the data.

In some embodiments, the controller is further configured to move a valid data from the volatile memory to the non-volatile memory in response to the command.

In some embodiments, the controller is further configured to preclude the volatile memory from having the self-refresh operation performed thereon after the movement of the valid data.

In some embodiments, the controller is further configured to identify the valid data from the data.

In some embodiments, the volatile memory includes a first refresh area and a second refresh area. The first refresh area is configured to store a first quantity of a first valid data. The second refresh area is configured to store a second quantity, less than the first quantity, of a second valid data. The controller is further configured to move only the second valid data to the non-volatile memory in response to the command. The controller is further configured to preclude the second refresh area from having a partial-self-refresh operation performed thereon after the movement of the second valid data.

In some embodiments, the controller is further configured to allow the first refresh area to have the partial-self-refresh operation performed thereon after the movement of the second valid data.

In some embodiments, the volatile memory includes a memory row. The non-volatile memory is configured to store a valid data from the memory row in response to the command. The controller is further configured to move the valid data from the non-volatile memory back to the volatile memory in response to a command to exit from the power-saving mode. The memory row stores no valid data after the movement of the valid data back to the volatile memory. The controller is further configured to preclude the memory row from having a partial-self-refresh operation performed thereon after the movement of the valid data back to the volatile memory.

In some embodiments, the volatile memory includes a first memory row and a second memory row. The non-volatile memory is configured to store a first valid data from the first memory row and a second valid data from the second memory row in response to the command. The controller is further configured to move the first valid data and the second valid data from the non-volatile memory back to the first memory row in response to a command to exit from the power-saving mode. After the movement of the first valid data and the second valid data back to the first memory row, the controller is further configured to allow the first memory row to have a partial-self-refresh operation performed thereon and preclude the second memory row from having the partial-self-refresh operation performed thereon.

In some embodiments, after the movement of the first valid data and the second valid data back to the first memory row, the controller is further configured to allow the first memory row to be accessed.

Another aspect of the present disclosure provides a hybrid memory system. The hybrid memory system comprises a volatile memory and a non-volatile memory. The volatile memory includes a first memory row and a second memory row. The non-volatile memory is configured to store a first valid data from the first memory row and a second valid data from the second memory row in response to a command to enter a power-saving mode. The controller is configured to, in response to a command to exit from the power-saving mode, move both the first valid data and the second valid data to the first memory row. The controller is configured to preclude the second memory row, in response to the command, from being accessed for the second valid data.

In some embodiments, the controller is further configured to preclude the second memory row from having the partial-self-refresh operation performed thereon.

Another aspect of the present disclosure provides a method. The method comprises: storing data in a volatile memory; moving the data from the volatile memory to a non-volatile memory in response to a command to enter a power-saving mode; and precluding the volatile memory from having a self-refresh operation performed thereon after the movement of the data.

In some embodiments, the method further comprises: storing a valid data in the volatile memory; moving the valid data from the volatile memory to the non-volatile memory in response to the command; and precluding the volatile memory from having a self-refresh operation performed thereon after the movement of the valid data.

In some embodiments, the method further comprises: precluding the volatile memory from having the self-refresh operation performed thereon after the movement of the valid data.

In some embodiments, the method further comprises: (1) storing a first quantity of a first valid data by a first refresh area; (2) storing a second quantity, less than the first quantity, of a second valid data by a second refresh area; (3) moving only the second valid data to the non-volatile memory in response to the command; and (4) precluding the second refresh area from having a partial-self-refresh operation performed thereon after the movement of the second valid data.

In some embodiments, the method further comprises: allowing the first refresh area to have the partial-self-refresh operation performed thereon after the movement of the second valid data.

In some embodiments, the method further comprises: storing a valid data from a memory row of the volatile memory in the non-volatile memory in response to the command; moving the valid data from the non-volatile memory back to the volatile memory in response to a command to exit from the power-saving mode; and precluding the memory row from having the partial-self-refresh operation performed thereon after the movement of the valid data back to the volatile memory, wherein the memory row stores no valid data after the movement of the valid data back to the volatile memory.

In some embodiments, the method further comprises: precluding the memory row from being accessed for the valid data after the movement of the valid data back to the volatile memory.

In some embodiments, the method further comprises: storing a first valid data from a first memory row of the volatile memory in the non-volatile memory in response to the command; storing a second valid data from a second memory row of the volatile memory in the non-volatile memory in response to the command; moving the first valid data and the second valid data from the non-volatile memory back to the first memory row in response to a command to exit from the power-saving mode; and allowing the first memory row to have a partial-self-refresh operation performed thereon and precluding the second memory row from having the partial-self-refresh operation performed thereon after the movement of the first valid data and the second valid data back to the first memory row.

In the present disclosure, since the volatile memory 14 in the power-saving mode is disabled while data integrity is still maintained, power consumption of the volatile memory in the power-saving mode is relatively efficient.

In some existing DRAMs, it is still necessary to perform a self-refresh operation on the DRAMs in a power-saving mode in order to maintain data integrity. Hence, power consumption of the DRAMs is relatively inefficient.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

DETAILED DESCRIPTION

Figure 1:
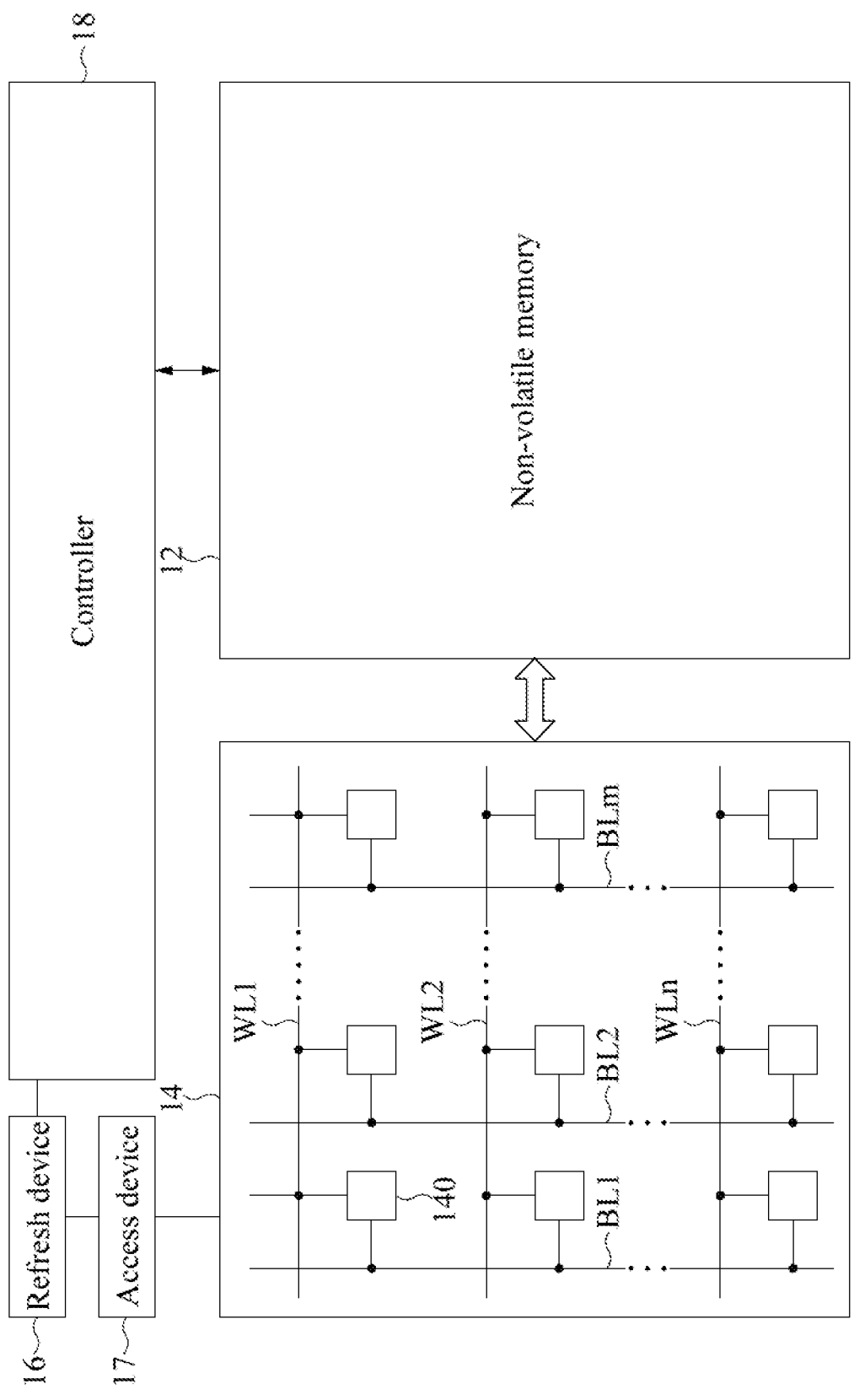
FIG. 1 is a schematic diagram of a hybrid memory system, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a hybrid memory system 10, in accordance with some embodiments of the present disclosure. Referring to FIG. 1, the hybrid memory system 10 includes a non-volatile memory 12, a volatile memory 14, a refresh device 16, an access device 17 and a controller 18. In the present embodiment, the hybrid memory system 10 is integrated in a device, and enclosed in a housing. However, the present disclosure is not limited thereto.

The non-volatile memory 12 functions to store data. In an embodiment, the non-volatile memory 12 includes a NAND flash memory. In other embodiments, the non-volatile memory 12 includes a read-only memory (ROM), a programmable read-only memory (PROM), an electrically alterable read-only memory (EAROM), an erasable programmable read-only memory (EPROM), or an electrically erasable programmable read-only memory (EEPROM).

The volatile memory 14 functions to store data. The volatile memory 14, in the present embodiment, includes a dynamic random access memory (DRAM). The volatile memory 14 includes a memory array. The memory array includes a plurality of memory cells 140. The memory cell 140 functions to store data. In addition to the memory cells 140, the memory array further includes a plurality of word lines WL1 to WLn and a plurality of bit lines BL1 to BLm, wherein n and m are positive integers. The word lines WL1 to WLn and the bit lines BL1 to BLm are used to control operation of the associated memory cells 140. The memory cells 140 in a single row and a word line for accessing those memory cells 140 can together be deemed as a memory row. However, the present disclosure is not limited thereto.

The refresh device 16 functions to perform a self-refresh operation on the volatile memory 14. The self-refresh operation refers to the procedure in which the refresh device 16 automatically executes a refresh operation by, for example, using an internal refresh counter. There is no need for the refresh device 16 to obtain refresh request from, for example, a processor external to the hybrid memory system 10 to perform the self-refresh operation. The refresh device 16 and/or other devices in the hybrid memory system 10 can generate, on their own, any information required to perform the self-refresh operation. Additionally, the refresh device 16 refreshes the volatile memory 14 in a fashion in which, for example, a charge is read from the memory cell 140, and the charge is immediately written hack to the memory cell 140. However, the present disclosure is not limited thereto. The refresh operation may further include other detailed operations.

The access device 17, connected to the refresh device 16 and the volatile memory 14, functions to access the volatile memory 14 to obtain the data stored in the volatile memory 14, in particular, the memory cell 140.

The controller 18, connected to the refresh device 16 and the non-volatile memory 12, functions to control the refresh device 16 and the access device 17. In particular, the controller 18 functions to control a movement of a data between the non-volatile memory 12 and the volatile memory 14.

During operation, the controller 18 receives a command to enter a power-saving mode, and, in response to the command, moves data stored in the volatile memory 14 from the volatile memory 14 to the nonvolatile memory 12.

Generally, in a power-saving mode, a refresh device is required to perform a self-refresh operation on a volatile memory to maintain data integrity.

Since the data was moved from the volatile memory 14 to the non-volatile memory 12, there is no data stored in the volatile memory 14. Thus, there is no longer a need for the self-refresh operation to be performed on the volatile memory 14 to maintain data integrity. Accordingly, by disabling the self-refresh function on the volatile memory 14, the controller 18 precludes the volatile memory 14 from having the self-refresh operation performed thereon after the movement of the data and in particular in the power-saving mode.

In the present disclosure, since the volatile memory 14 in the power-saving mode is disabled, power consumption of the volatile memory 14 in the power-saving mode is relatively efficient.

In some existing DRAMs, it is still necessary to perform a self-refresh operation on the DRAMs in a power-saving mode to maintain data integrity. Hence, power consumption the DRAMs is relatively inefficient.

Figure 2:
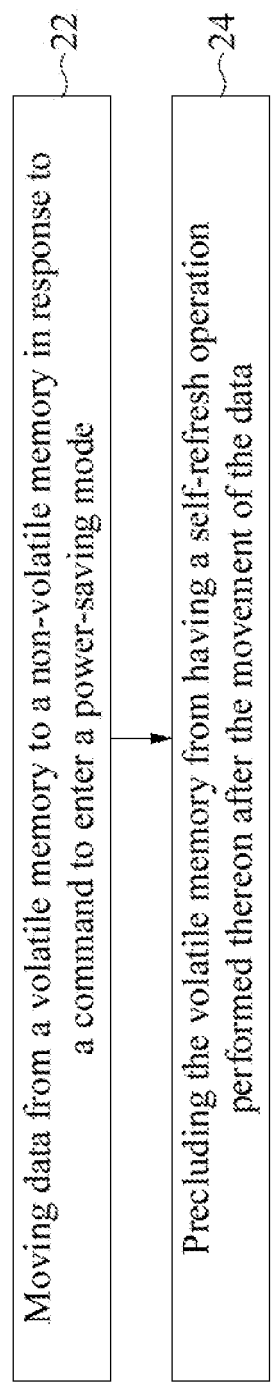
FIG. 2 is a flow chart of a method of operating a hybrid memory system, in accordance with some embodiments of the present disclosure.

FIG. 2 is a flow chart of a method 20 of operating a hybrid memory system, in accordance with some embodiments of the present disclosure. Referring to FIG. 2, the method 20 includes operations 22 and 24.

The method 20 begins with operation 22, in which data stored in a volatile memory is moved from the volatile memory to a non-volatile memory in response to a command to enter a power-saving mode.

The method 20 proceeds to operation 24, in which the volatile memory is precluded from having a self-refresh operation performed thereon after the movement of the data and in particular in the power-saving mode.

The method 20 is merely an example, and is not intended to limit the present disclosure beyond what is explicitly recited in the claims. Additional operations can be provided before, during, and after the method 20, and some operations described can be replaced, eliminated, or moved around for additional embodiments of the method.

In the present disclosure, power consumption of a hybrid memory system adopting the method 20 is relatively efficient in a power-saving mode.

Figure 3:
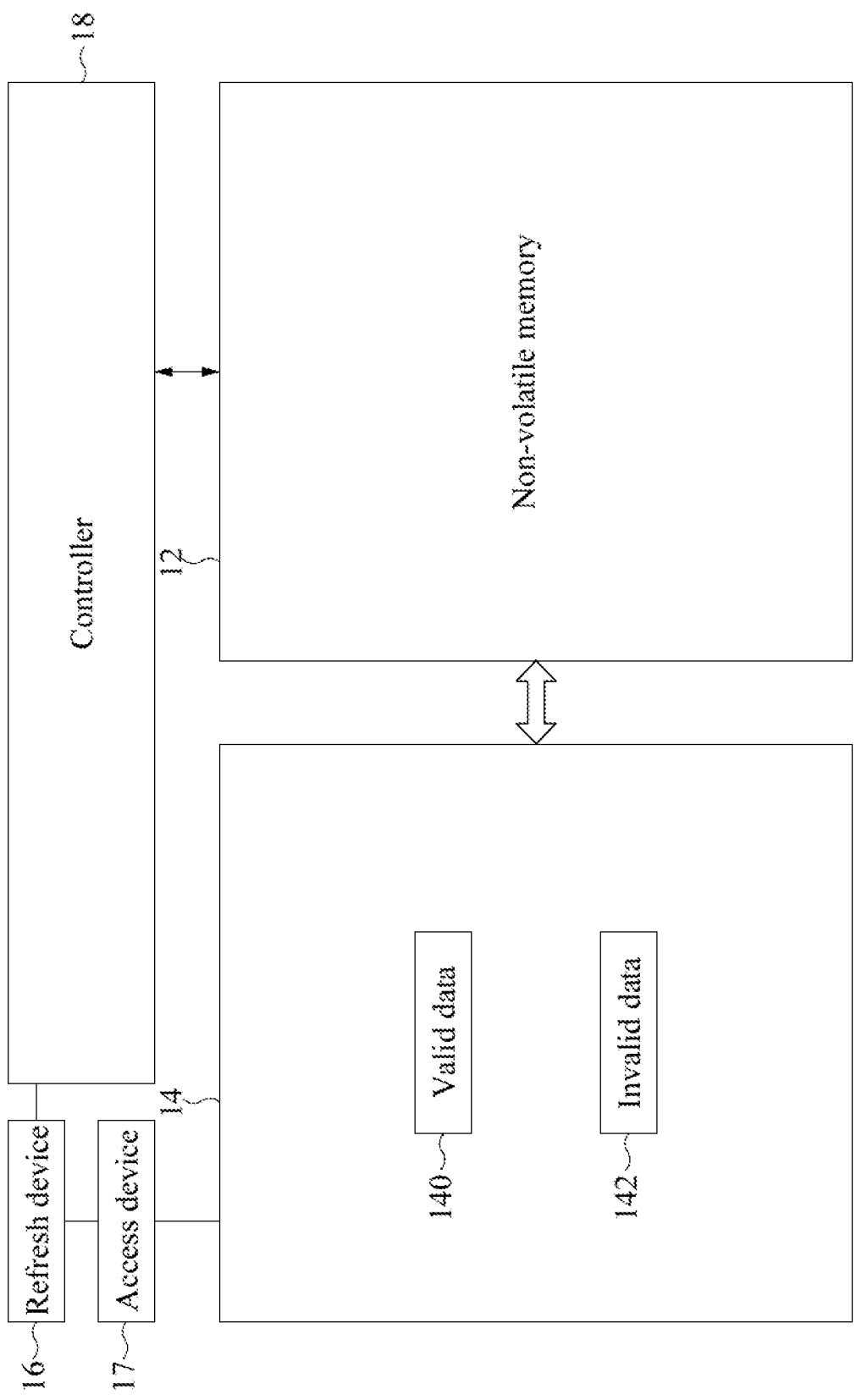
FIG. 3 is a schematic diagram of the hybrid memory system shown in FIG. 1 in a scenario, in accordance with some embodiments of the present disclosure.

FIG. 3 is a schematic diagram of the hybrid memory system 10 shown in FIG. 1 in a scenario, in accordance with some embodiments of the present disclosure. Referring to FIG. 3, in the scenario, the volatile memory 14 stores a data including a valid data 140 and an invalid data 142. In the present embodiment, the valid data 140 refers to data which will be used by the controller 18 or an external processor (not shown) electrically connected to the hybrid memory system 10. Conversely, the invalid data 142 refers to data which will not be used. However, the present disclosure is not limited thereto. In other embodiments, there may be another appropriate basis on which to classify a valid data and an invalid data.

During operation, the controller 18 identifies the valid data 140 from the data according to the information provided by the external processor.

Figure 4:
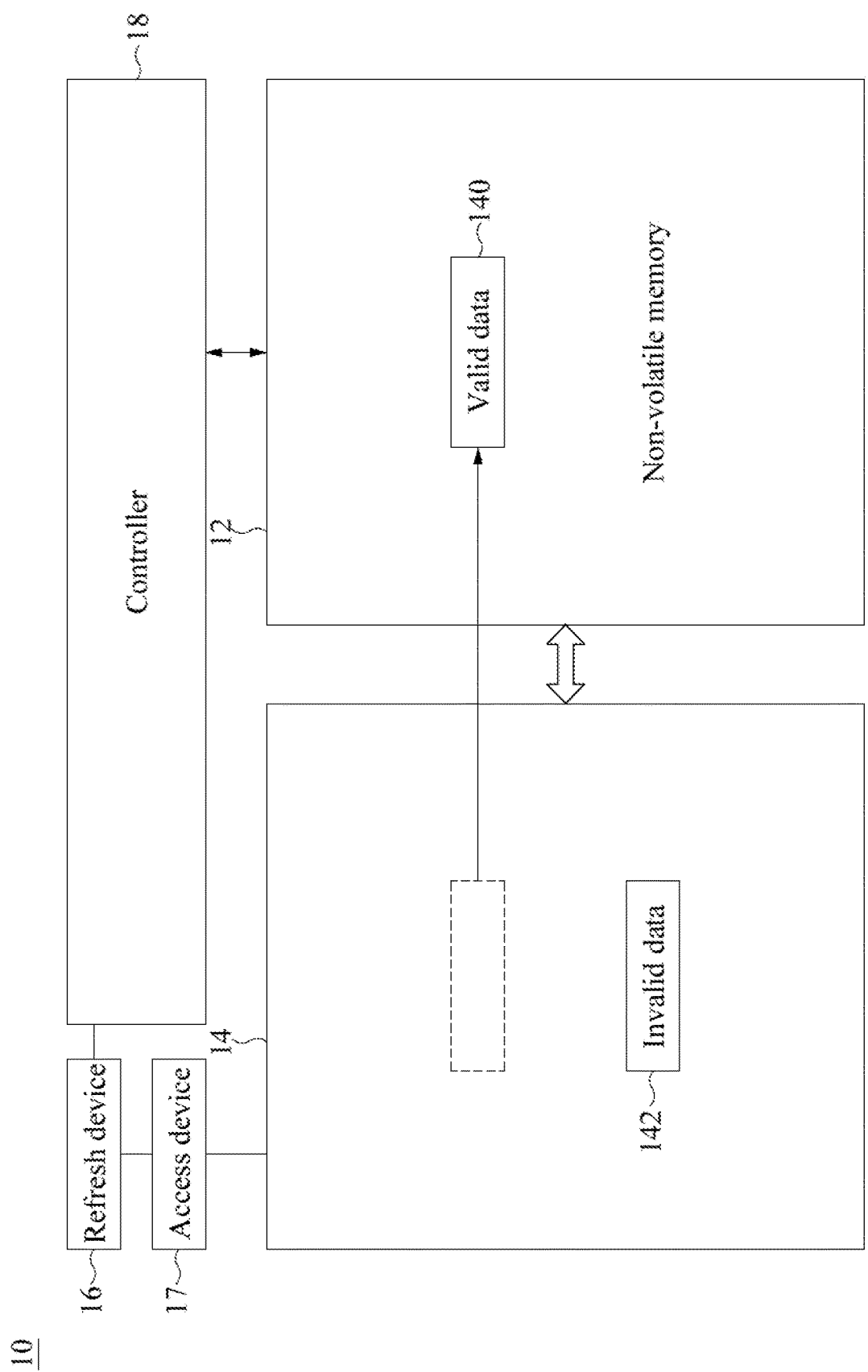
FIG. 4 is a schematic diagram illustrating a movement operation from the volatile memory to the non-volatile memory in the scenario of FIG. 3, in accordance with some embodiments of the present disclosure.

FIG. 4 is a schematic diagram illustrating a movement operation from the volatile memory 14 to the non-volatile memory 12 in the scenario of FIG. 3, in accordance with some embodiments of the present disclosure. Referring to FIG. 4, subsequent to the identification, the controller 18 moves the valid data 140 from the volatile memory 14 to the non-volatile memory 12 in response to the command.

Since only the valid data 140 is moved (i.e., the invalid data 142 is not moved), power consumption of the volatile memory 14 is relatively efficient.

Figure 5:
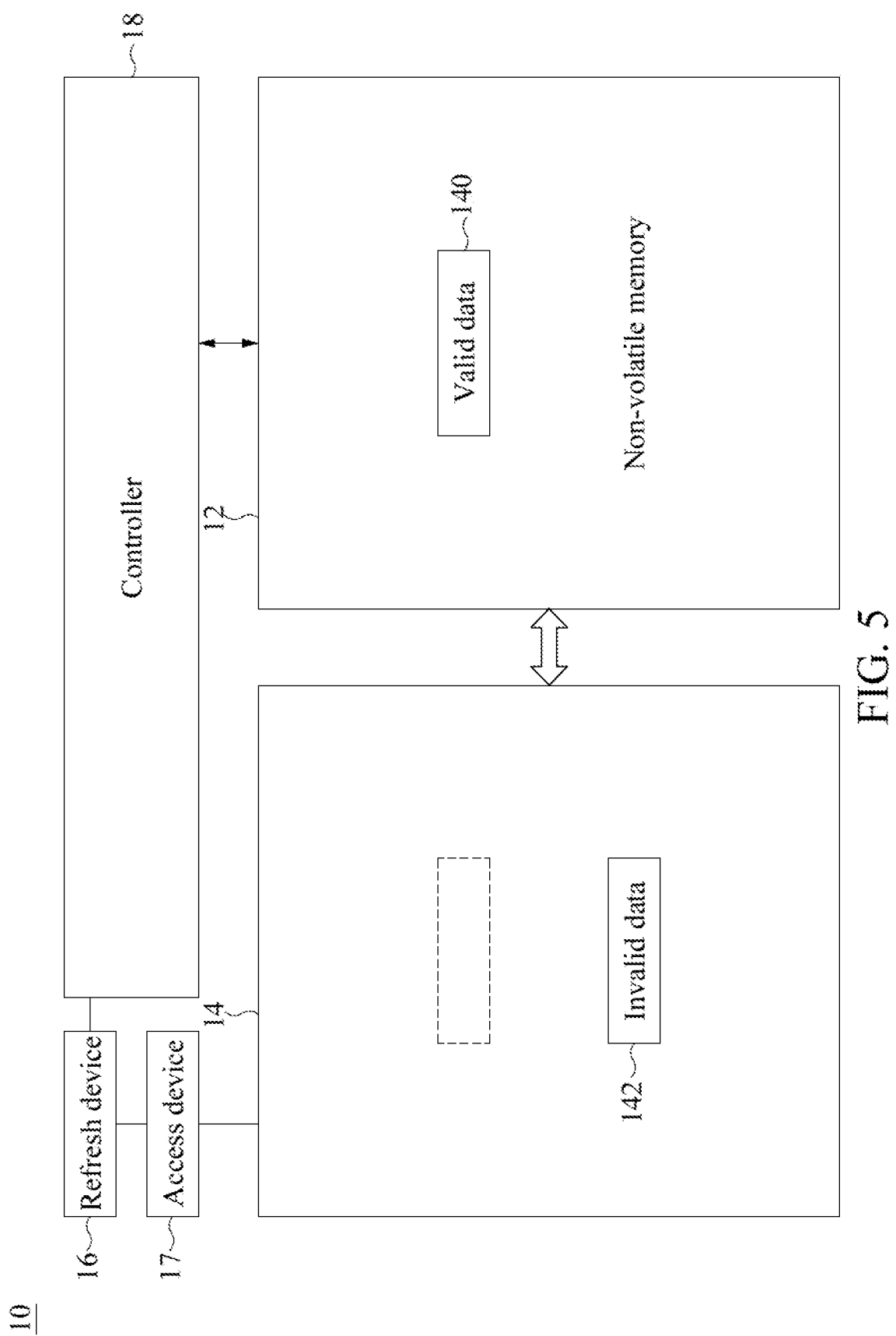
FIG. 5 is a schematic diagram illustrating a disabling operation in the scenario of FIG. 3, in accordance with some embodiments of the present disclosure.

FIG. 5 is a schematic diagram illustrating a disabling operation in the scenario of FIG. 3, in accordance with some embodiments of the present disclosure. Referring to FIG. 5, by disabling the volatile memory 14, the controller 18 precludes the volatile memory 14 from having the self-refresh operation performed thereon after the movement of the valid data 140 and in particular in the power-saving is mode.

Without the self-refresh operation in the power-saving mode, the invalid data 142 will eventually be lost. However, the invalid data 142 will not be used. Hence, data integrity is not affected.

In the present disclosure, since the volatile memory 14 in the power-saving mode is disabled, power consumption of the volatile memory 14 in the power-saving mode is relatively efficient.

Figure 6:
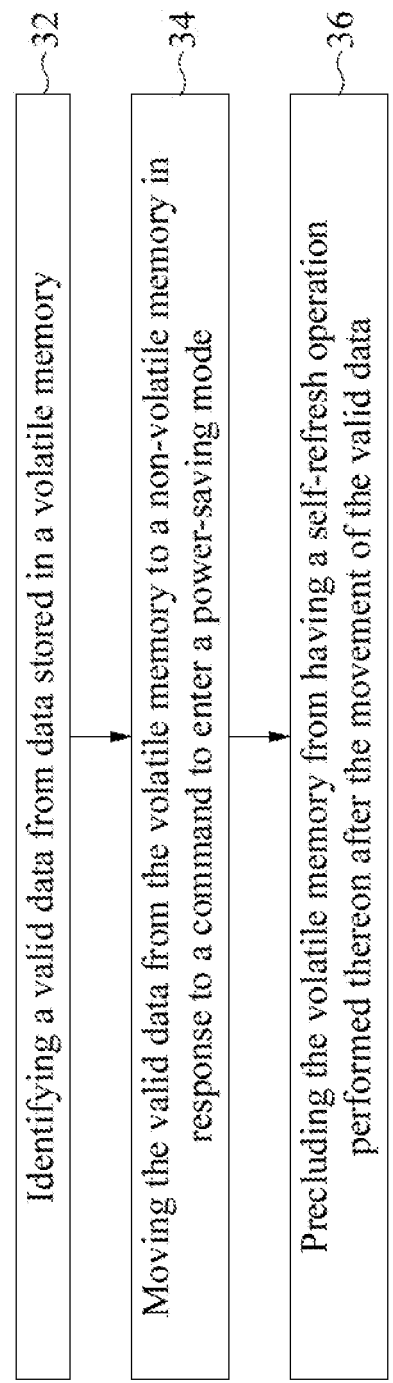
FIG. 6 is a flow chart of another method of operating a hybrid memory system, in accordance with some embodiments of the present disclosure.

FIG. 6 is a flow chart of another method 30 of operating a hybrid memory system, in accordance with some embodiments of the present disclosure. Referring to FIG. 6, the method 30 includes operations 32, 34 and 36.

The method 30 begins with operation 32, in which a valid data is identified from data stored in a volatile memory.

The method 30 proceeds to operation 34, in which the valid data is moved from the volatile memory to a non-volatile memory in response to a command to enter a power-saving mode.

The method 30 continues with operation 36, in which the volatile memory without the valid data is precluded from having a self-refresh operation performed thereon after the movement of the valid data and in particular in the power-saving mode.

The method 30 is merely an example, and is not intended to limit the present disclosure beyond what is explicitly recited in the claims. Additional operations can be provided before, during, and after the method 30, and some operations described can be replaced, eliminated, or moved around for additional embodiments of the method.

In the present disclosure, power consumption of a hybrid memory system adopting the method 30 is relatively efficient in a power-saving mode.

Figure 7:
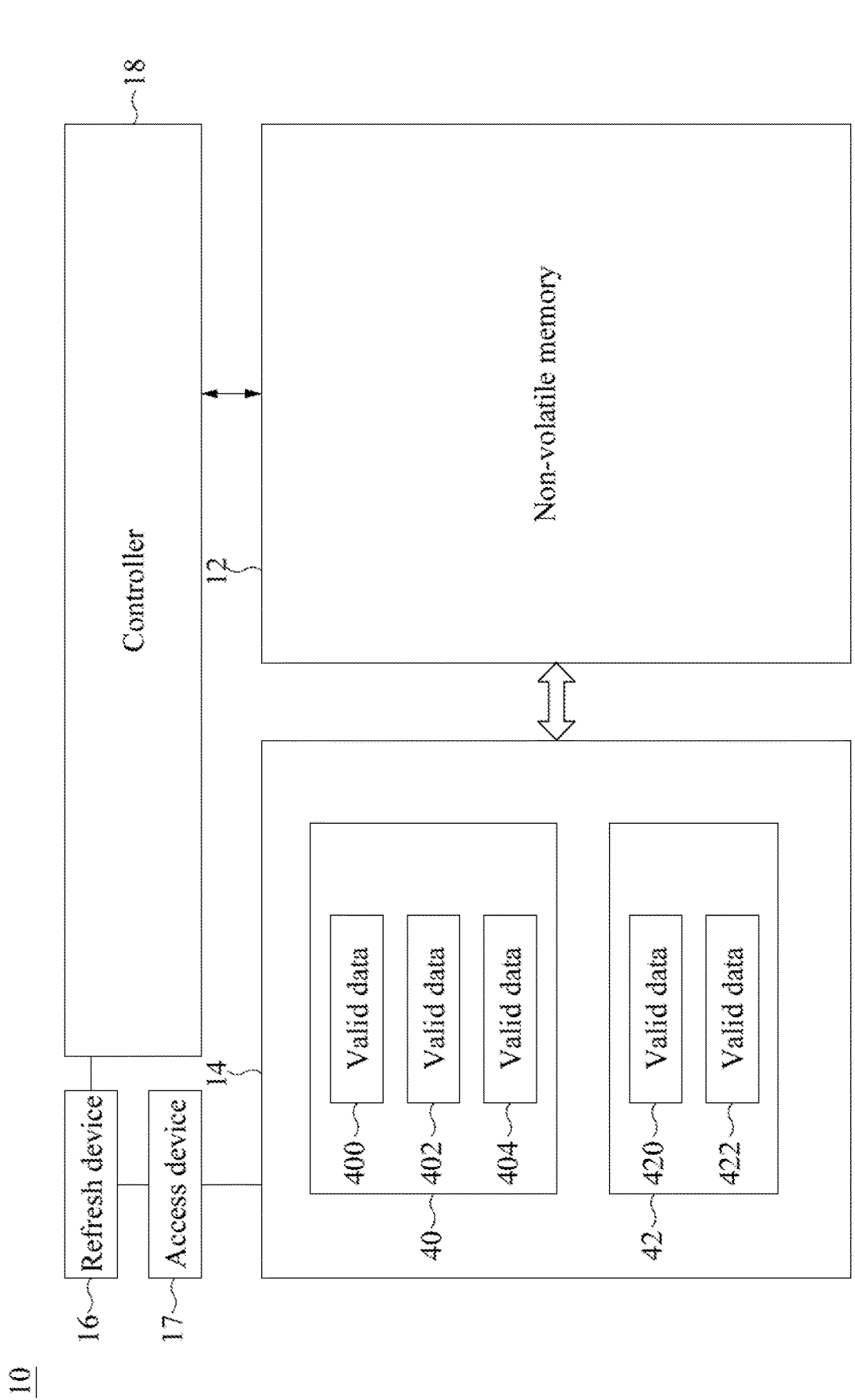
FIG. 7 is a schematic diagram of the hybrid memory system shown in FIG. 1 in another scenario, in accordance with some embodiments of the present disclosure.

FIG. 7 is a schematic diagram of the hybrid memory system 10 shown in FIG. 1 in another scenario, in accordance with some embodiments of the present disclosure. Referring to FIG. 7, the volatile memory 14 includes a first refresh area 40 and a second refresh area 42.

The first refresh area 40 stores first valid data 400, 402 and 404. Such quantity of the valid data only serves as an example. The first refresh area 40, in some embodiments, includes a plurality of memory rows. However, the present disclosure is not limited thereto. In some embodiments, the first refresh area 40 includes a single memory row. Moreover, in some embodiments, the memory rows of the first refresh area 40 belong to a single bank. However, the present disclosure is not limited thereto. The memory rows may belong to different banks. That is, the first refresh area 40 may include a single bank, a plurality of banks, a single memory row, or a plurality of memory rows. The present disclosure is not limited to any specific type as previously mentioned.

The second refresh area 42 stores second valid data 420 and 422. That is, a second quantity of the second valid data is less than the first quantity of the first valid data. Such quantity of valid data only serves as an example. The second refresh area 42 includes a plurality of memory rows. However, the present disclosure is not limited thereto. In some embodiments, the second refresh area 42 includes a single memory row. Moreover, in some embodiments, the memory rows of the second refresh area 42 belong to a single bank. However, the present disclosure is not limited thereto. The memory rows may belong to different banks. That is, the second refresh area 42 may include a single bank, a plurality of banks, a single memory row, or a plurality of memory rows. The present disclosure is not limited to any specific type as previously mentioned.

During operation, the controller 18 determines that the second quantity is less than the first quantity according to a storing data record which is maintained by the information from the external processor.

Figure 8:
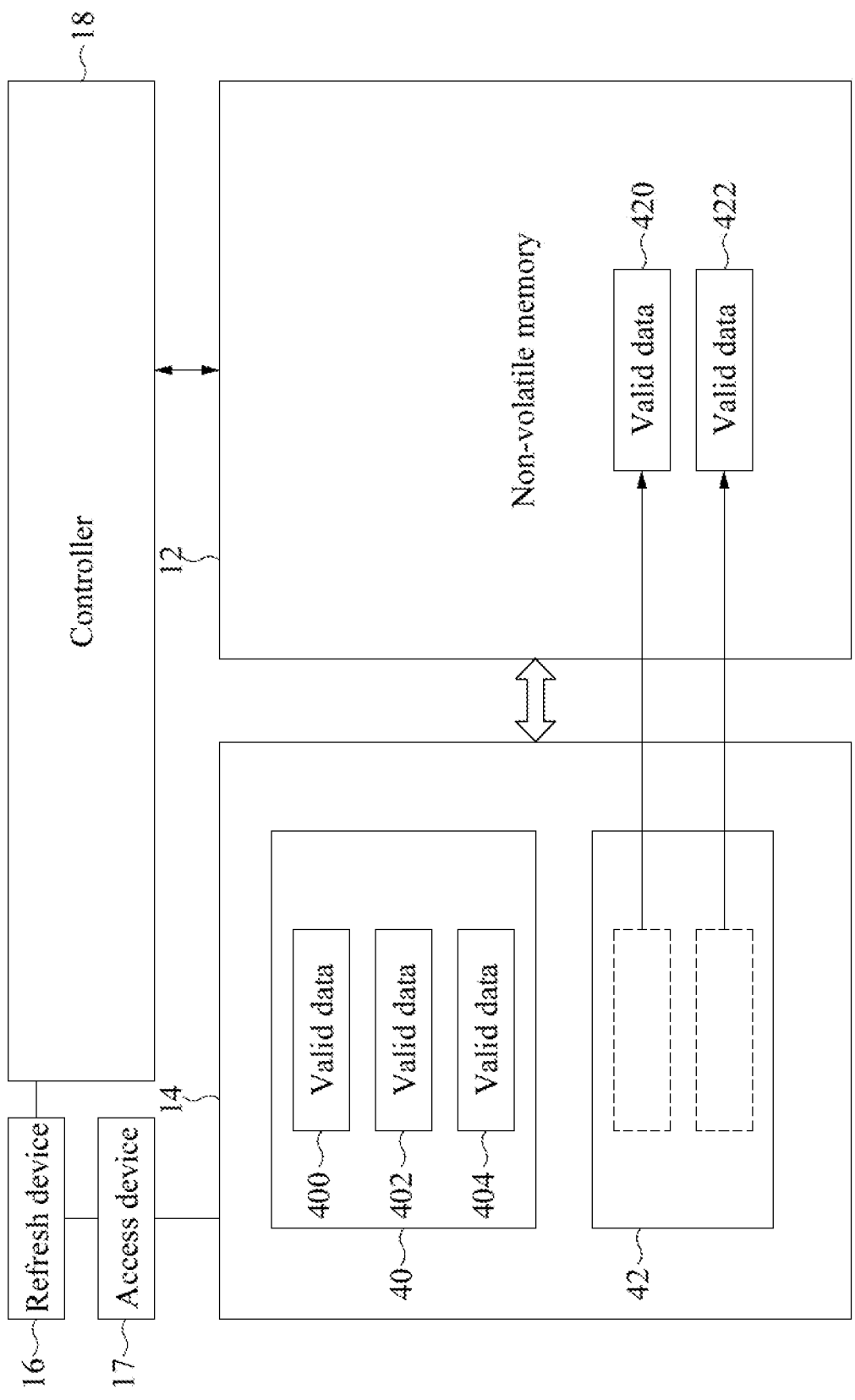
FIG. 8 is a schematic diagram illustrating a movement operation from the volatile memory to the non-volatile memory in the scenario of FIG. 7, in accordance with some embodiments of the present disclosure.

FIG. 8 is a schematic diagram illustrating a movement operation from the volatile memory 14 to the non-volatile memory 12 in the scenario of FIG. 7, in accordance with some embodiments of the present disclosure. Referring to FIG. 8, the controller 18 moves only the second valid data 420 and 422 (i.e., moves the lesser second quantity) to the non-volatile memory 12 in response to the command.

Figure 9:
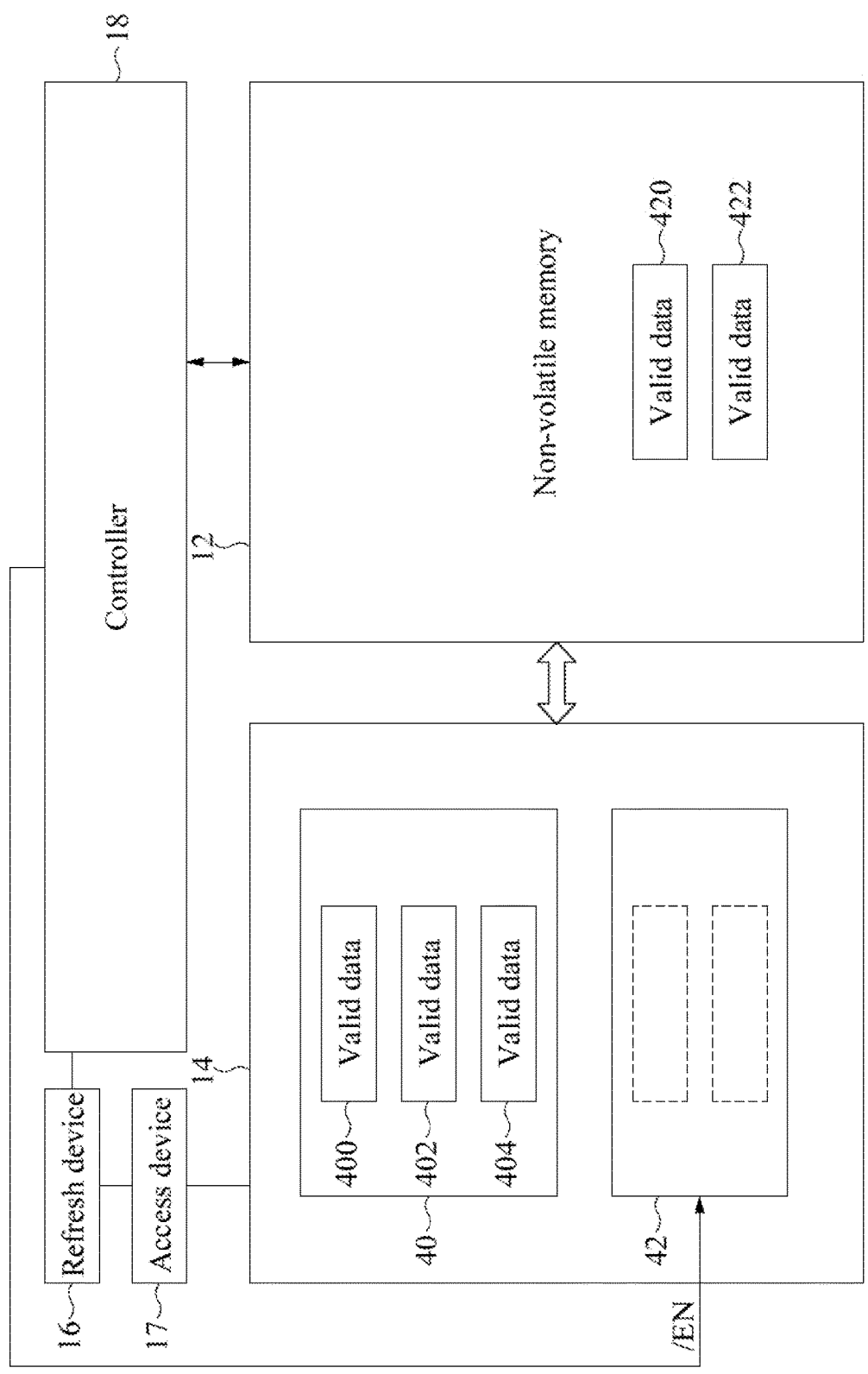
FIG. 9 is a schematic diagram illustrating a disabling operation in the scenario of FIG. 7, in accordance with some embodiments of the present disclosure.

FIG. 9 is a schematic diagram illustrating a disabling operation in the scenario of FIG. 7, in accordance with some embodiments of the present disclosure. Referring to FIG. 9, the controller 18 disables the second refresh area 42 whose valid data 420 and 422 was moved to the non-volatile memory 12.

Figure 10:
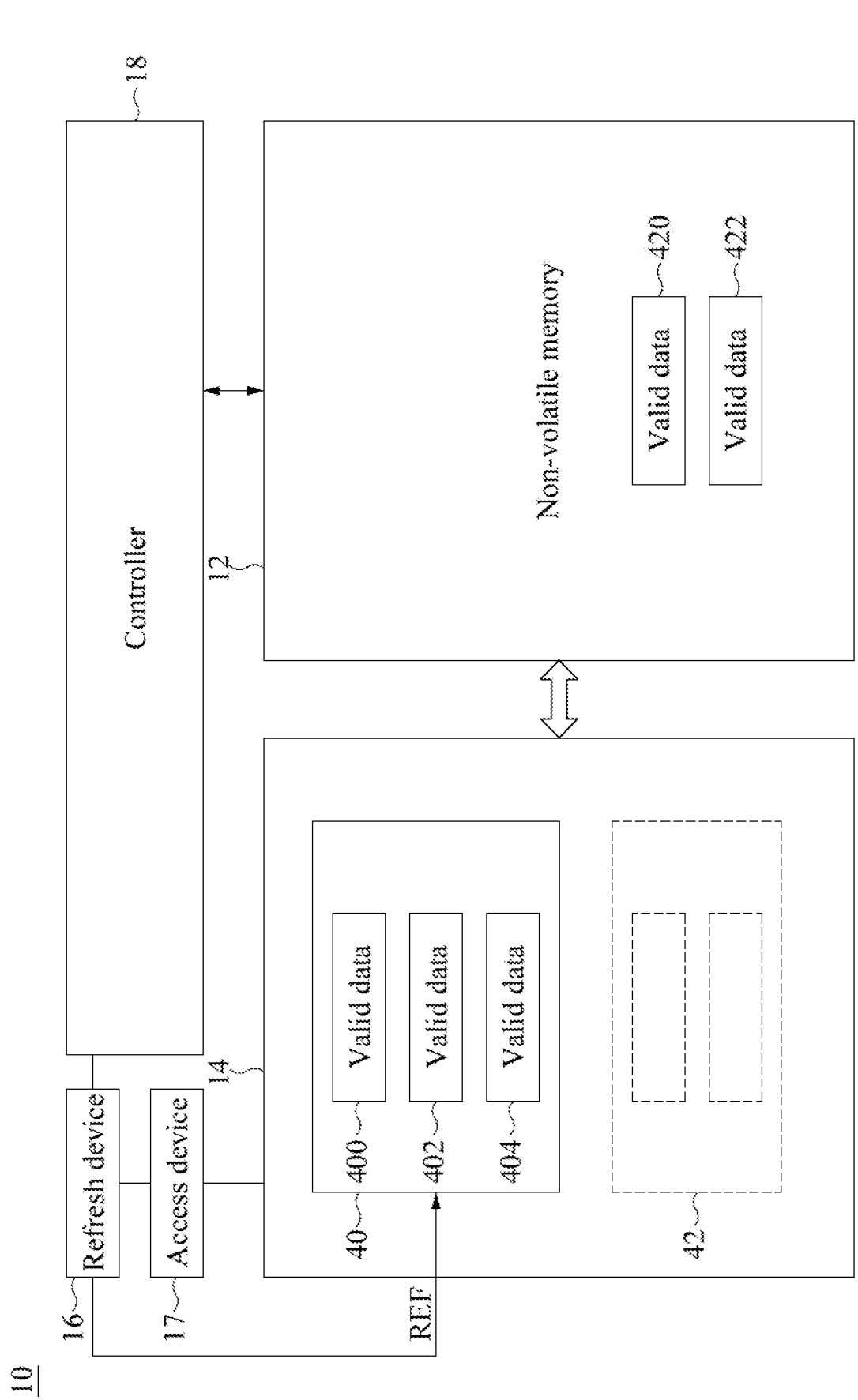
FIG. 10 is a schematic diagram illustrating a partial-self-refresh operation in the scenario of FIG. 7, in accordance with some embodiments of the present disclosure.

FIG. 10 is a schematic diagram illustrating a partial-self-refresh operation in the scenario of FIG. 7, in accordance with some embodiments of the present disclosure. Referring to FIG. 10, by disabling the second refresh area 42, the controller 18 precludes the second refresh area 42 from having a partial-self-refresh operation performed thereon after the movement of the second valid data 420 and 422. However, the controller 14 allows the first refresh area 40 to have the partial-self-refresh operation performed thereon to maintain data integrity of the first valid data 400, 402 and 404.

In the present disclosure, in a power-saving mode, instead of a self-refresh operation, a partial-self-refresh operation is performed. As a result, power consumption of the volatile memory 14 in the power-saving mode is relatively efficient.

In some existing DRAMs, in a power-saving mode, a self-refresh operation is performed, such that all of refresh areas of the DRAMs are required to be refreshed. As a result, power consumption of the DRAMs is relatively inefficient.

Figure 11:
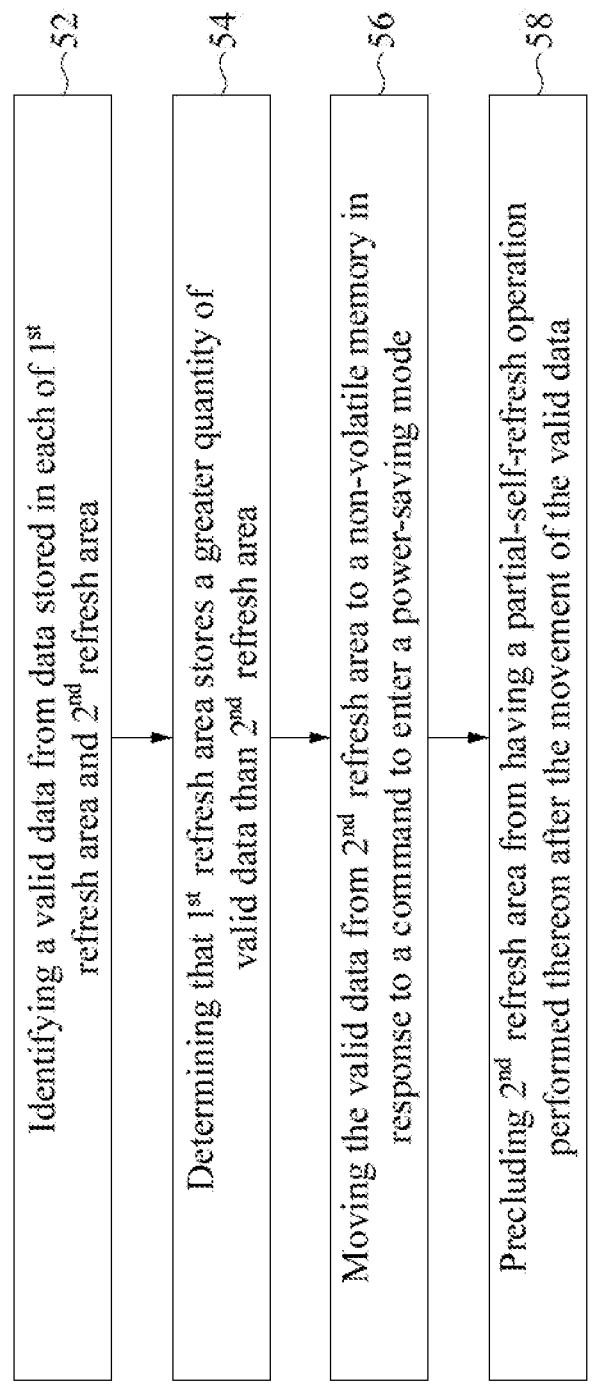
FIG. 11 is a flow chart of yet another method of operating a hybrid memory system, in accordance with some embodiments of the present disclosure.

FIG. 11 is a flow chart of yet another method 50 of operating a hybrid memory system, in accordance with some embodiments of the present disclosure. Referring to FIG. 11, the method 50 includes operations 52, 54, 56 and 58.

The method 50 begins with operation 52, in which a valid data is identified from data stored in each of a first refresh area and a second refresh area.

The method 50 proceeds to operation 54, in which it is determined that the first refresh area stores a greater quantity of valid data than the second refresh area.

The method 50 continues with operation 56, in which the valid data is moved from the second refresh area to a non-volatile memory in response to a command to enter a power-saving mode.

The method 50 continues with operation 58, in which the second refresh area is precluded from having a partial-self-refresh operation performed thereon after the movement of the valid data.

The method 50 is merely an example, and is not intended to limit the present disclosure beyond what is explicitly recited in the claims. Additional operations can be provided before, during, and after the method 50, and some operations described can be replaced, eliminated, or moved around for additional embodiments of the method.

In the present disclosure, power consumption of a hybrid memory system adopting the method 50 is relatively efficient in a power-saving mode.

Figure 12:
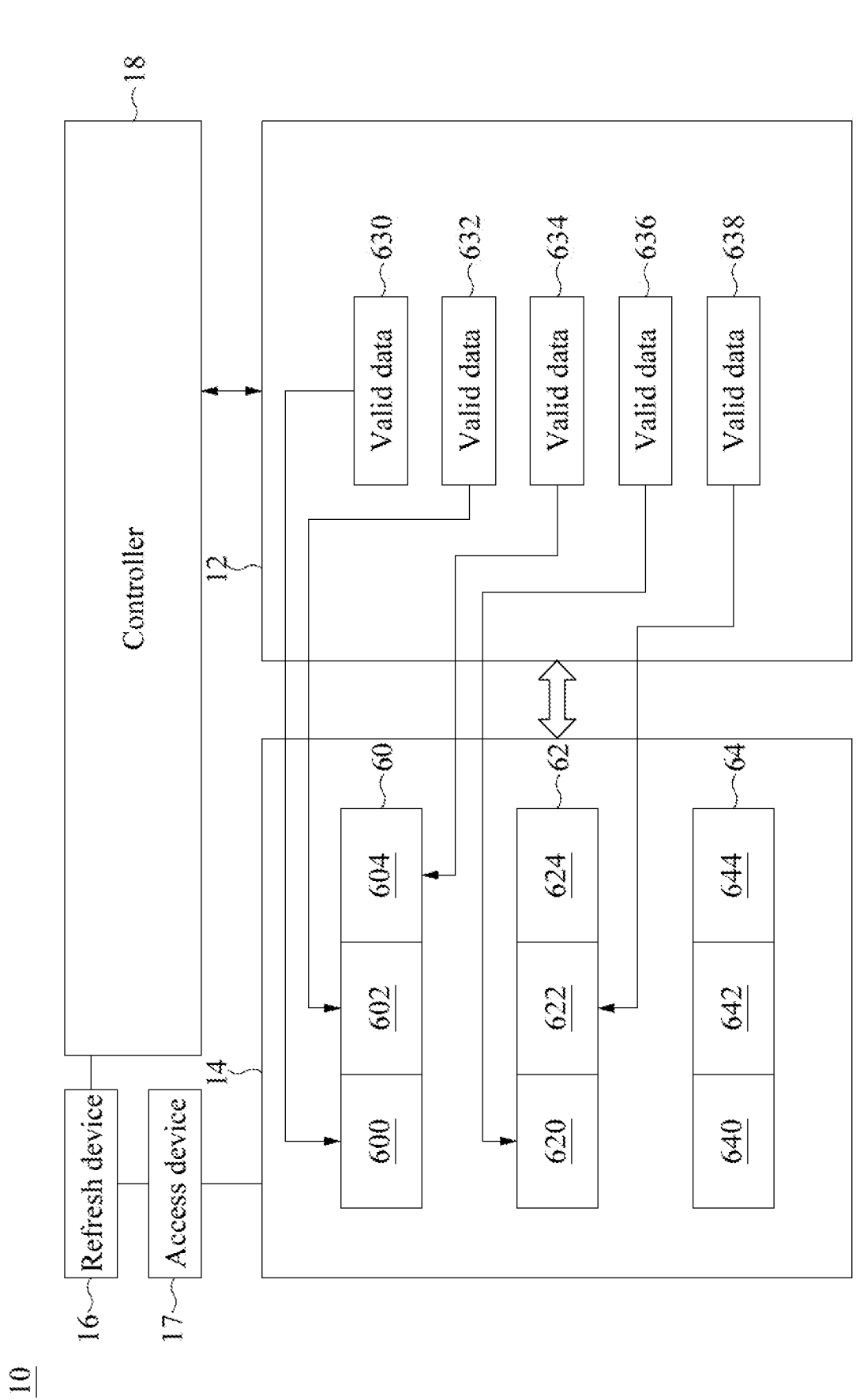
FIG. 12 is a schematic diagram illustrating another movement operation from the non-volatile memory to the volatile memory, in accordance with some embodiments of the present disclosure.
Figure 13:
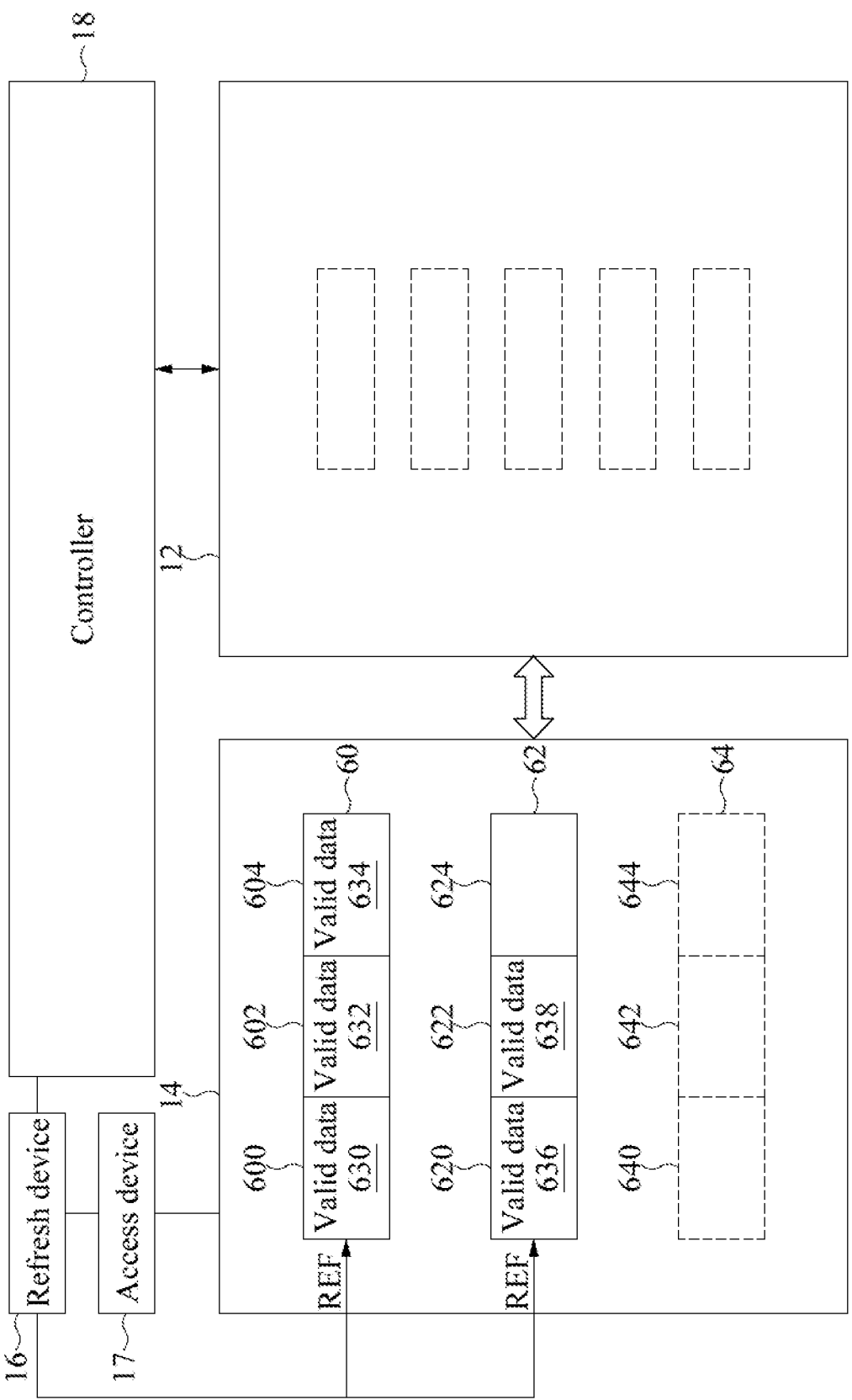
FIG. 13 is a schematic diagram illustrating another refresh operation, in accordance with some embodiments of the present disclosure.
Figure 14:
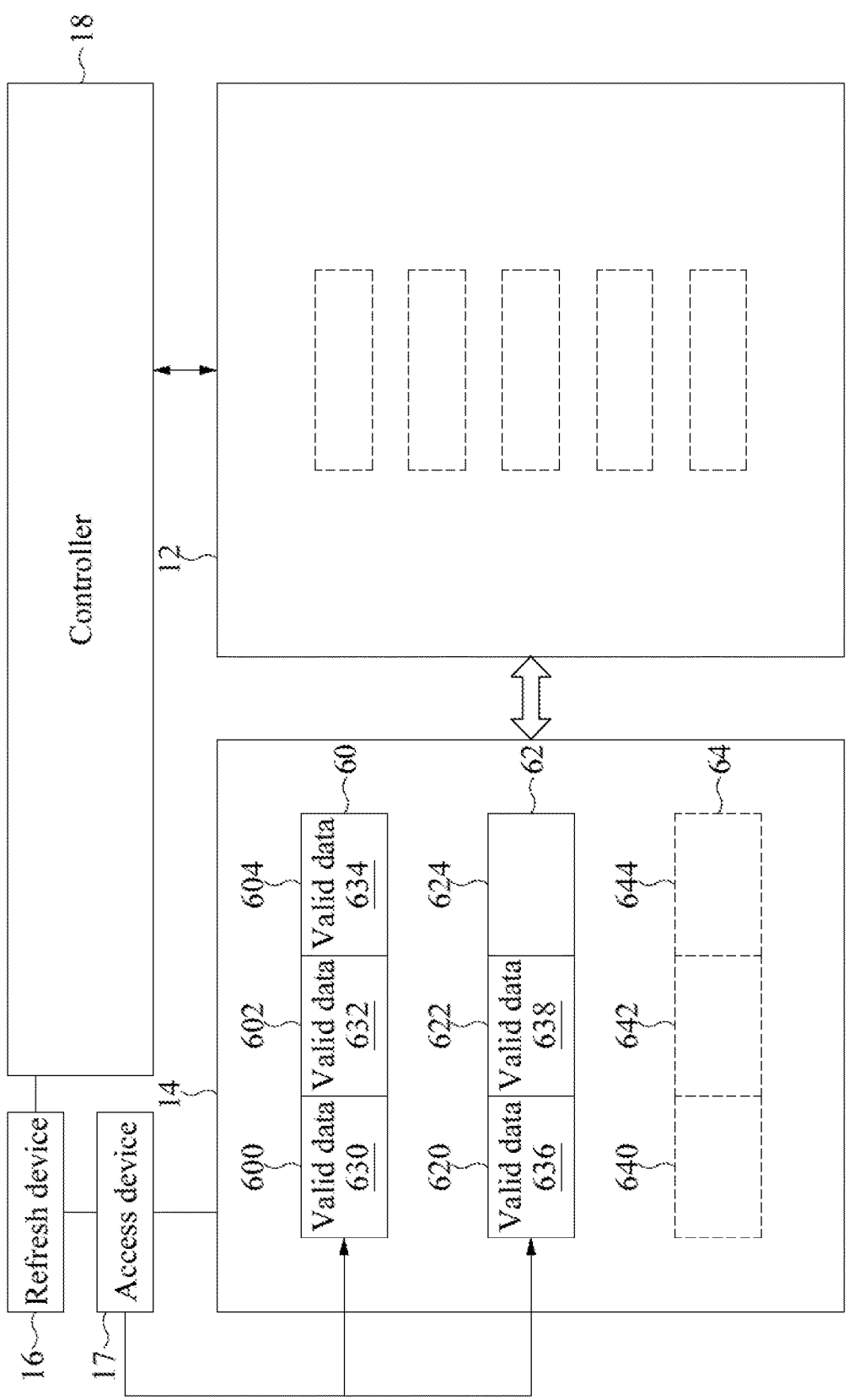
FIG. 14 is a schematic diagram illustrating an access operation of the hybrid memory system shown in FIG. 1, in accordance with some embodiments of the present disclosure.

FIG. 12 is a schematic diagram illustrating another movement operation from the non-volatile memory 12 to the volatile memory 14, in accordance with some embodiments of the present disclosure. Operations described and illustrated with reference to FIGS. 12 to 14 are able to be subsequent to each of a first embodiment shown in FIG. 1, a second embodiment shown in FIGS. 3 to 5, and a third embodiment shown in FIGS. 7 to 10, when appropriate.

Referring to FIG. 12, the volatile memory 14 includes a first memory row 60, a second memory row 62 and a third memory row 64.

The first memory row 60 includes memory spaces 600, 602 and 604.

The second memory row 62 includes memory spaces 620, 622 and 624.

The third memory row 64 includes memory spaces 640, 642 and 644.

The non-volatile memory 12 stores first valid data 630 and 632 from the first memory row 60, second valid data 634 and 636 from the second memory row 62 and third valid data 638 from the third memory row 64 in response to the command.

During operation, the controller 18, in response to a command to exit from the power-saving mode, moves the valid data 630, 632, 634, 636 and 638 back to the first memory row 60 until the first memory row 60 has no sufficient memory spaces to store more valid data. Next, the controller 18 moves the remaining valid data to the second memory row 62.

FIG. 13 is a schematic diagram illustrating another refresh operation, in accordance with some embodiments of the present disclosure. Referring to FIG. 13, in further detail, the controller 18 moves the first valid data 630 and 632 and the second valid data 634 from the non-volatile memory 12 back to the memory spaces 600, 602, and 604, respectively, of the first memory row 60, in response to a command to exit from the power-saving mode.

Moreover, the controller 18 moves the second valid data 636 and the third valid data 638 from the non-volatile memory 12 back to the memory spaces 620 and 622, respectively, of the second memory row 62, in response to a command to exit from the power-saving mode.

The third memory row 64, which provided the third valid data 638 in response to a command to enter a power-saving mode, does not store any valid data from the non-volatile memory 12 in response to a command to exit from the power-saving mode. In short, the valid data 630, 632, 634, 636 and 638 are centralized to the first memory row 60 and the second memory row 62.

After the movement of the valid data 630, 632, 634, 636 and 638 back to the volatile memory 14, the controller 16 allows the first memory row 60 and the second memory row 62 to have a partial-self-refresh operation performed thereon to maintain data integrity of the valid data 630, 632, 634, 636 and 638. Moreover, the controller 16 precludes the third memory row 64 from having the partial-self-refresh operation performed thereon. As a result, as discussed in the embodiment of FIG. 10, power consumption of the volatile memory 14 in the power-saving mode is relatively efficient.

FIG. 14 is a schematic diagram illustrating an access operation of the hybrid memory system 10 shown in FIG. 1, in accordance with some embodiments of the present disclosure. Referring to FIG. 14, after the movement of the valid data 630, 632, 634, 636 and 638 back to the volatile memory 14, the controller 18 allows the first memory row 60 and the second memory row 62 to be accessed and prohibits the third memory row 64 from being accessed for the valid data 638.

Generally, to access a data from a memory row, it is necessary to perform many preparation operations, such as a pre-charge operation, an active operation, and/or other operations.

In the present embodiment, the third valid data 638, which was provided by the third memory row 64, is stored with the second valid data 636 in the second memory row 62. There is no need to perform the preparation operation to access the third memory row 64 when it is necessary to access the third valid data 638. In further detail, the preparation operation, which would otherwise be performed for three memory rows 60, 62 and 64, are performed for only two memory rows 60 and 62. As a result, an access of the volatile memory 14 is relatively efficient.

Figure 15:
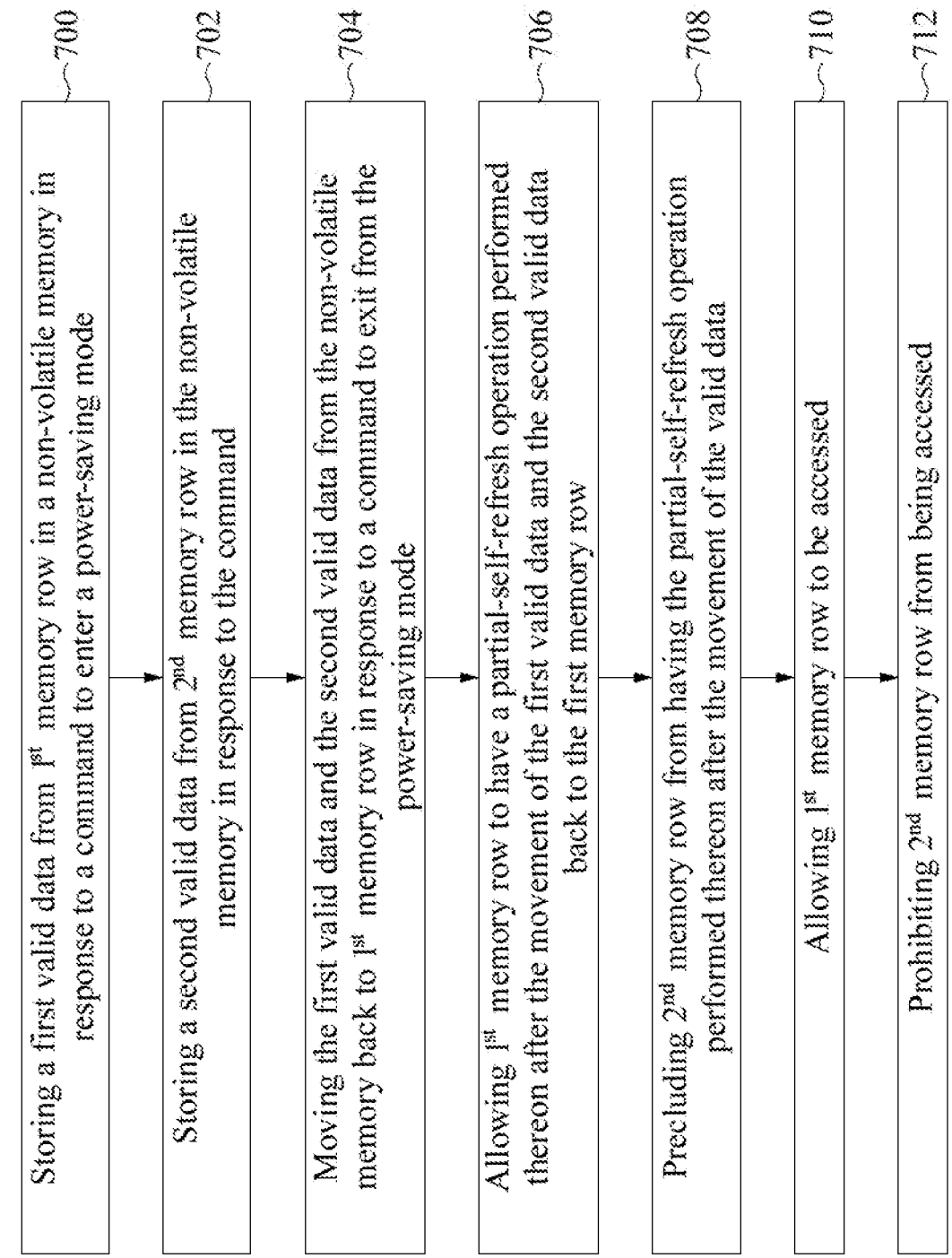
FIG. 15 is a flow chart of still another method of operating a hybrid memory system, in accordance with some embodiments of the present disclosure.

FIG. 15 is a flow chart of still another method 70 of operating a hybrid memory system, in accordance with some embodiments of the present disclosure. Referring to FIG. 15, the method 70 includes operations 700, 702, 704, 706, 708, 710 and 712.

The method 70 begins with operation 700, in which a first valid data from a first memory row is stored in a non-volatile memory in response to a command to enter a power-saving mode.

The method 70 proceeds to operation 702, in which a second valid data from a second memory row is stored in the non-volatile memory in response to the command.

The method 70 continues with operation 704, in which the first valid data and the second valid data are moved from the non-volatile memory back to the first memory row in response to a command to exit from the power-saving mode.

The method 70 proceeds to operation 706, in which the first memory row is allowed to have a partial-self-refresh operation performed thereon after the movement of the first valid data and the second valid data back to the first memory row.

The method 70 continues with operation 708, in which the second memory row is precluded from having the partial-self-refresh operation performed thereon after the movement of the valid data.

The method 70 proceeds to operation 710, in which the first memory row is allowed to be accessed.

The method 70 continues with operation 712, in which the second memory row is prohibited from being accessed for the second valid data.

The method 70 is merely an example, and is not intended to limit the present disclosure beyond what is explicitly recited in the claims. Additional operations can be provided before, during, and after the method 70, and some operations described can be replaced, eliminated, or moved around for additional embodiments of the method.

In the present disclosure, power consumption of a hybrid memory system adopting the method 70 is relatively efficient in a power-saving mode.

In the present disclosure, since the volatile memory 14 in the power-saving mode is disabled, power consumption of the volatile memory 14 in the power-saving mode is relatively efficient.

One aspect of the present disclosure provides a hybrid memory system. The hybrid memory system includes a non-volatile memory, a volatile memory and a controller. The volatile memory is configured to store data. The controller is configured to move the data from the volatile memory to the non-volatile memory in response to a command to enter a power-saving mode. The controller is configured to preclude the volatile memory from having a self-refresh operation performed thereon after the movement of the data.

Another aspect of the present disclosure provides a hybrid memory system. The hybrid memory system comprises a volatile memory and a non-volatile memory. The volatile memory includes a first memory row and a second memory row. The non-volatile memory is configured to store a first valid data from the first memory row and a second valid data from the second memory row, in response to a command to enter a power-saving mode. The controller is configured to, in response to a command to exit from the power-saving mode, move both the first valid data and the second valid data to the first memory row. The controller is configured to, in response to the command, preclude the second memory row from being accessed for the second valid data.

Another aspect of the present disclosure provides a method. The method comprises storing data in a volatile memory; moving the data from the volatile memory to a non-volatile memory in response to a command to enter a power-saving mode; and precluding the volatile memory from having a self-refresh operation performed thereon after the movement of the data.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A hybrid memory system, comprising:
a non-volatile memory;
a volatile memory configured to store data; and
a controller configured to move at least a portion of the data from the volatile memory to the non-volatile memory in response to a command to enter a power-saving mode, and to preclude a location of the volatile memory from having a self-refresh operation, wherein the location is a location from where the portion of the data was moved,
wherein the volatile memory includes:
a first refresh area configured to store a first quantity of a first valid data; and
a second refresh area configured to store a second quantity, less than the first quantity, of a second valid data, wherein the portion of the data is the second valid data, and the first valid data is other portions of the data,
wherein the controller is configured to move only the second valid data to the non-volatile memory in response to the command, and to preclude the second refresh area from having a partial-self-refresh operation performed thereon after the movement of the second valid data,
wherein the location is the second refresh area, and
wherein the controller is configured to allow the first refresh area to have the partial-self-refresh operation performed thereon after the movement of the second valid data.

2. The hybrid memory system of claim 1, wherein the controller is further configured to identify the first valid data and the second valid data from the data.

3. The hybrid memory system of claim 1, wherein the volatile memory includes a memory row,
wherein the controller is further configured to move the first valid data and the second valid data from the non-volatile memory back to the volatile memory in response to a command to exit from the power-saving mode,
wherein the memory row stores no valid data after the movement of the first valid data and the second valid data back to the volatile memory, and
wherein the controller is configured to preclude the memory row from having the partial-self-refresh operation performed thereon after the movement of the first valid data and the second valid data back to the volatile memory.

4. The hybrid memory system of claim 1, wherein the volatile memory includes a first memory row and a second memory row,
  wherein the non-volatile memory is configured to store the first valid data from the first memory row and the second valid data from the second memory row in response to the command,
  wherein the controller is further configured to move the first valid data and the second valid data from the non-volatile memory back to the first memory row in response to a command to exit from the power-saving mode, and
  wherein after the movement of the first valid data and the second valid data back to the first memory row, the controller is configured to allow the first memory row to have a partial-self-refresh operation performed thereon and to continue to preclude the second memory row from having the partial-self-refresh operation performed thereon.

5. The hybrid memory system of claim 4, wherein after the movement of the first valid data and the second valid data back to the first memory row, the controller is further configured to allow the first memory row to be accessed.

6. A hybrid memory system, comprising:
  a volatile memory including:
    a first memory row; and
    a second memory row;
  a non-volatile memory configured to store a first valid data from the first memory row and a second valid data from the second memory row, in response to a command to enter a power-saving mode; and
  a controller configured to, in response to a command to exit from the power-saving mode, move both the first valid data and the second valid data to the first memory row, and preclude the second memory row from being accessed for the second valid data.

7. The hybrid memory system of claim 6, wherein the controller is further configured to preclude the second memory row from having the partial-self-refresh operation performed thereon.

8. A method, comprising:
  storing data in a volatile memory, the data comprising a first portion and a second portion;
  storing a first quantity of a first valid data by a first refresh area, wherein the first valid data is the first portion of the data;
  storing a second quantity, less than the first quantity, of a second valid data by a second refresh area, wherein the second portion of the data is the second valid data;
  moving only the second valid data from the volatile memory to a non-volatile memory in response to a command to enter a power-saving mode;
  precluding the second refresh area from having a partial-self-refresh operation performed thereon after the movement of the second valid data, and the second refresh area is a location from where the second valid data was moved; and
  allowing the first refresh area to have the partial-self-refresh operation performed thereon after the movement of the second valid data.

9. The method of claim 8,
  wherein the first valid data and the second valid data are stored from a memory row of the volatile memory in the non-volatile memory in response to the command; and
  the method further comprising:
  moving the first valid data and the second valid data from the non-volatile memory back to the volatile memory in response to a command to exit from the power-saving mode; and
  precluding the memory row from having the partial-self-refresh operation performed thereon after the movement of the first valid data and the second valid data back to the volatile memory, wherein the memory row stores no valid data after the movement of the first valid data and the second valid data back to the volatile memory.

10. The method of claim 9, further comprising:
  precluding the memory row from being accessed for the first valid data and the second valid data after the movement of the first valid data and the second valid data back to the volatile memory.

11. The method of claim 8,
  wherein the first valid data is stored from a first memory row of the volatile memory in the non-volatile memory in response to the command;
  wherein the second valid data is stored from a second memory row of the volatile memory in the non-volatile memory in response to the command; and
  the method further comprising:
  moving the first valid data and the second valid data from the non-volatile memory back to the first memory row in response to a command to exit from the power-saving mode; and
  allowing the first memory row to have a partial-self-refresh operation performed thereon and continuing to preclude the second memory row from having the partial-self-refresh operation performed thereon after the movement of the first valid data and the second valid data back to the first memory row.

* * * * *